United States Patent [19]
Grundke et al.

[11] Patent Number: 5,436,279
[45] Date of Patent: Jul. 25, 1995

[54] COATING MATERIALS CONTAINING A REACTION PRODUCT OF AN EPOXY NOVOLAK RESIN AND AN OLEFINICALLY UNSATURATED CARBOXYLIC ACID CROSSLINKABLE BY RADIATION

[75] Inventors: Ulrich Grundke; Klaus-Peter Liebetanz, both of Duisburg; Achim Hansen, Dusseldorf; Jürgen Zehrfeld, Voerde; Rainer Scharre; Werner Peters, both of Kempen, all of Germany

[73] Assignees: Rutgerswerke Aktingesellschaft; Lackwere Peters GmbH & Co. KG, both of Germany

[21] Appl. No.: 189,971

[22] Filed: Feb. 1, 1994

Related U.S. Application Data

[63] Continuation of Ser. No. 880,682, May 8, 1992, abandoned.

[30] Foreign Application Priority Data

May 24, 1991 [DE] Germany .................. 41 16 957.3

[51] Int. Cl.⁶ .......................... C08F 2/50; C08K 3/18; C08K 3/36; C08L 63/10
[52] U.S. Cl. .......................... 522/14; 522/79; 522/81; 522/83; 522/97; 522/100; 522/103
[58] Field of Search ............. 522/14, 100, 103, 79, 522/81, 83, 82, 97

[56] References Cited

U.S. PATENT DOCUMENTS

| | | | |
|---|---|---|---|
| 3,958,996 | 5/1976 | Inskip | 522/81 |
| 4,169,732 | 10/1979 | Shipley | 96/35.1 |
| 4,427,823 | 1/1984 | Inagaki et al. | 522/83 |
| 4,544,623 | 10/1985 | Audykowski et al. | 430/280 |
| 4,701,478 | 10/1987 | Jellinek et al. | 522/97 |
| 5,102,702 | 4/1992 | Grundke et al. | 522/97 |

FOREIGN PATENT DOCUMENTS 2024657 1/1990 Japan .

OTHER PUBLICATIONS

Sugazawa et al, JP 2–24657, PTO Translation, Jan. 1990.

*Primary Examiner*—Susan W. Berman
*Attorney, Agent, or Firm*—Bierman and Muserlian

[57] ABSTRACT

A coating material crosslinkable by radiation comprising a) an olefinic unsaturated ester of an epoxy novolac resin, b) a binder formed by reaction of an epoxy compound having more than one epoxide group per molecule with at least one carboxylic acid in a molar ratio of epoxy groups per carboxyl group of 1:0.5 to 0.9 and subsequent reaction of the resulting reaction product with at least one unsaturated isocyanate ester formed by reaction of a compound with at least two isocyanate groups with a member of the group consisting of hydroxyl containing acrylic acid, methacrylic acid and cyanacrylic acid esters, c) at least one latent hardener, d) at least one photoinitiator e) 80–120% by weight of fillers and (f) additives, adjuvants and solvents and protective films formed with them.

8 Claims, No Drawings

5,436,279

COATING MATERIALS CONTAINING A REACTION PRODUCT OF AN EPOXY NOVOLAK RESIN AND AN OLEFINICALLY UNSATURATED CARBOXYLIC ACID CROSSLINKABLE BY RADIATION

PRIOR APPLICATION

This application is a continuation of U.S. patent application Ser. No. 07/880,682 filed May 8, 1992, now abandoned.

Coating material for the production of protective coatings which are crosslinkable by radiation, especially if used in electronics, must meet stringent requirements which can be fulfilled by selection of suitable binders and additives as well as by their formulation in the coating material mixture. EP-A 0,075,537 describes coating material which contain as the binder a photosensitive and thermally hardenable epoxy resin, a hardener, solvents and 10 to 50% by weight of finely divided fillers based on the photosensitive substance. These coating material are suitable for uniform coating of circuit boards by the curtain pouring process. Compared with the prior art, they have improved edge covering, adhesion, and solder bath stability. In the practical use of the coating of circuit boards, however, there are still deficiencies which can be eliminated only by fundamentally different coating material.

The desired good edge covering is possible only through the use of high molecular weight resins. Normally, this results in a lower resolution which, however, is peremptory for fine structures, more difficult developing, and increased brittleness of the exposed lacquer films. Lacquer splinters forming after the exposure when the boards are taken out of the centering pins lead to defects in subsequent circuit boards. As these lacquer splinters are opaque to UV light during exposure, the lacquer film is not prepolymerized at these points and is detached during developing with so-called pinholes being created.

Multiple coating to obtain good edge covering is not possible as the photo- and thermally hardenable polymers are polymerized too strongly in a repeated drying process, and hence subsequent developing is no longer possible, or respectively, due to the radiation hardening taking place only, superficially too strong an undercutting results in the developing process.

OBJECTS OF THE INVENTION

It is an object of the invention to provide coating material crosslinkable by radiation to form films having good adhesion also to lead-tin alloys, good solder bath stability and very good edge covering while giving a high resolution for fine structures, are easy to develop after exposure and show no undercut and brittleness.

It is another object of the invention to provide novel films for electronic components having improved characteristics.

These and other objects and advantages of the invention will become obvious from the following detailed description.

THE INVENTION

The novel coating material of the invention crosslinkable by radiation are comprised of a) an olefinic unsaturated ester of an epoxy novolac resin, b) a binder formed by reaction of an epoxy compound having more than one epoxide group per molecule with at least one carboxylic acid in a molar ratio of epoxy group per carboxyl group of 1:0.5 to 0.9 and subsequent reaction of the resulting reaction product with at least one unsaturated isocyanate ester formed by reaction of a compound with at least two isocyanate groups with a member of the group consisting of hydroxyl containing acrylic acid, methacrylic acid and cyanacrylic acid esters, c) at least one latent hardener, d) at least one photoinitiator and e) optionally further fillers, additives, adjuvants and solvents.

The coating material are useful for the production of coatings for electronics and electrical engineering, particularly as solder resist lacquers as well as for the production of protective masks, particularly masks which are produced by curtain coating, as well as of solder resist masks which are produced by screen printing, roller coating, tampon printing or centrifugal deposition or by conventional or electrostatic spraying or by a combination of these methods.

It has been found that coating materials which contain as binder components an olefinic unsaturated ester of an epoxy novolac resin and a binder obtained by reaction of an epoxide with more than one epoxide group per molecule with one or more carboxylic acids in a molar ratio of the epoxide groups to the carboxyl groups of 1:0.5 to 0.9 and subsequent reaction of the reaction product with one or more unsaturated isocyanate carbamate esters produced by reaction of compounds with at least two isocyanate groups with hydroxyl group containing acrylic, methacrylic or cyanacrylic acid esters, fulfill the stipulated properties. By mixing the two components, systems are obtained which are different in their properties from corresponding systems with only one binder component with a corresponding ratio of olefinic unsaturated and epoxide groups.

The coating materials of the invention are crosslinkable by radiation and have a good solder bath stability, adhere well to all substrates common in the circuit board industry, particularly to copper, lead/tin as well as on epoxy and phenolic resin bound circuit boards. Even in fine structures, a high resolution can be achieved. The lacquer films can be easily developed after exposure and above all with ecophilic solvents or with alkaline acqueous solutions. No undercut is created, that is, fine ribbons or webs remain producible after development. Above all, however, the hardened lacquer film is not brittle, but has more or less plastic or thermoplastic components. The lacquer does not break off and the danger of defects due to lacquer splinters (pinholes) does not exist.

Multiple coating without exposure, development and final hardening of the individual layers is possible with the coating materials of the invention. But above all, the binder agents of the invention permit the respective coating materials to contain, even without solvents, a high proportion of finely divided fillers. Preferred are filler contents of 80 to 120 wt %, based on the binder mixture. Surprisingly, coating materials of relatively low viscosity and good flow properties can be produced despite this high proportion of filler. The coating materials are well suited for the curtain coating method and flow well and bubble-free, despite the high solids content, even if the layer thickness is high.

Excellent edge covering with lacquer edges that can be developed almost perpendicularly is thus achieved. Other advantages achieved by the high filler content are low volume shrinkage, hence the high drying layer thickness to be achieved, better edge covering, as well as the reliable and automatic closing of via holes through the applied coating.

The two binder components used according to the invention are known in themselves: Olefinic unsaturated esters of an epoxy novolac resin are simple reaction products of olefinic unsaturated carboxylic acids with novolacs whose phenolic hydroxyl groups are etherified with glycidyl groups. Examples of olefinic unsaturated carboxylic acids are acrylic acid, methacrylic acid, halogenized acrylic acid or methacrylic acid, cinnamic acid, or hydroxyalkyl acrylate or methacrylate semiesters of dicarboxylic acids, the hydroxyalkyl having preferably 2 to 6 carbon atoms. Generally, the acid is reacted with the polyepoxide in a ratio of 1 equivalent of acid per equivalent of epoxide, but, the respective equivalent ratios can be varied in the range of 0.8:1 to 1.2:1.

The epoxy novolac component corresponds to that described below for the binder component b. The reaction of the acids with the epoxy component occurs by known methods as described, for example, in EP-A 0,003,040 or EP-B 0,194,360.

Also known as olefinic unsaturated esters of epoxy novolacs are reaction products of a saturated or unsaturated polybasic acid anhydride with reaction produces of epoxy novolac resins and an unsaturated monocarboxylic acid as known from DE-A 3,613,107. These products have at 25° C. a viscosity of 2,000 to 4,000 mPa s.

Binders of component b are known from EP-B 0,194,360 wherein they are produced by reaction of an epoxide compound with more than one epoxide group per molecule with one or more carboxylic acids in the molar ratio of the epoxide groups to the carboxyl groups of 1:0.5 to 0.9 and subsequent reaction of the reaction product with one or more unsaturated isocyanate carbamate ester produced by reaction of compounds with at least two isocyanate groups with hydroxyl group containing acrylic acid, methacrylic acid or cyanacrylic acid esters.

Suitable as starting epoxy resins for these binders are all compounds which contain more than one epoxide group per molecule and they may be obtained either by reaction of polyphenols or polyalcohols and epichlorhydrin or by reaction of polyunsaturated compounds with organic peracids. Preferred are the reaction products of bisphenol A with epichlorhydrin in alkaline medium as well as the polyglycidyl ethers of resorcinol, butandiol, glycerine, trimethylolpropane and neopentyl glycol. Preferred examples of the polyunsaturated compounds epoxidized by peracids are epoxidized cyclo olefins such as 3,4-diepoxy-6-methyl-tetrahydro-benzyl-3',4'-diepoxy-6-methyl-tetrahydro-benzoate, vinylcyclohexendioxide as well as the anhydride based diglycidyl esters such as hexahydrophthalic acid or methylnadic acid anhydride.

Especially preferred are the novolacs whose phenolic hydroxyl groups are etherified with glycidyl groups such as bisphenol-A or bisphenol-F novolac epoxy resins or the corresponding ortho- or para-cresol epoxy resin novolac sytems or the respectively corresponding chlorinated or brominated products for low flammability formulations. The novolacs required for this purpose can be produced for example on the basis of phenol, ortho-, meta- or paracresol, dimethylphenols, higher alkylated phenols, for example nonyl phenyl, tertiary butyl phenol, or halogenized phenols as well as polyphenols, for example resorcinol, hydroquinone, pyrocatechin, pyrogallol, phloroglucin or also trihydroxyphenylmethane or tetrahydroxyphenyl ethane by reaction with aldehydes, preferably formaldehyde under acid catalysis.

For the purpose of a better viscosity adjustment, there may be added to these epoxy resins before the reaction with crboxylic acids mono- and bi-functional epoxide compounds, so-called reactive diluents.

As carboxylic acids may be used all common monocarboxylic acids and examples are unbranched monocarboxylic acids such as formic acid, acetic acid, propionic acid, lactic acid, stearic acid, and also aromatic carboxylic acids such as benzoic acid or cinnamic acid as well as phenylacetic acid and preferably unsaturated carboxylic acids of the type of acrylic acid and methacrylic acid.

The reaction takes place in a known manner by mixing together the liquid or dissolved reagents at elevated temperature. Important for the properties of the end product is the molar ratio of the epoxide groups to the carboxyl groups which must in any case be greater than 1 so that free epoxide groups are present which after the radiation-caused crosslinking make thermal hardening possible. Generally, the ratio is between 1:0.5 and 0.9.

The reaction of the epoxy resin systems with the monocarboxylic acids leads to reaction products which are eminently suitable for further reaction with unsaturated isocyanato carbamate esters. The isocyanato carbamate esters can be produced by reaction of polyisocyanates, e.g. 2,4- or 2,6-toluylene diisocyanates or respectively also their isomer mixtures (commercial name e.g. "Desmodur$^R$ T 80"), methylene diphenyl diisocyanate, 1,6-naphthylene diisocyante, isophorone diisocyanate, trimethylhexamethylene diisocyante, 4,4',4"-triphenylmethane triisocyanate or other known polyisocyantes with hydroxyl containing esters.

Examples of hydroxyl containing unsaturated esters are hydroxyl-ethyl or propyl acrylates or the corresponding hydroxylmethacrylates or hydroxy-cyanacrylates as well as butane or hexane diol monoacrylates.

The reaction takes place in a known manner in a 1:1 molar ratio. The unsaturated isocyanate carbamate esters have the formula

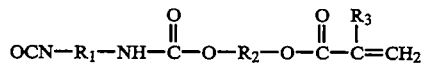

wherein R$_1$ is toluylene (2,4; 2,6)
4,4'-diphenylmethane-,
1,6-hexamethylene-,
1,5-naphthylene-,
isophoronetrimethylhexamethylene,
R$_2$ is C$_2$H$_4$-, C$_3$H$_6$ or C$_4$H$_8$ and
R$_2$ is C$_2$H$_4$-, C$_3$H$_6$ or C$_4$H$_8$ and
R$_3$ is H-, CH$_3$-, CN-, C$_2$H$_5$- or C$_3$H$_7$.

For the production of the coating materials of the invention, the binder components a) and b) are mixed in a weight ratio of 80:20 to 20:80 with one another and with one or more latent hardeners and optionally with additional fillers, additives and adjuvants as well as solvents.

For the controlled adjustment of the UV reactivity, the customary photoinitiators such as benzoins or benzildimethyl ketal, benzoin ether, benzophenones, dithiobis(benzothialcol), oxophosphoranes and combinations of aromatic sulfochlorides with disulfides or xanthogenates can be used to increase the polymerization rate. Exposure times of less than 30 seconds are adjustable without any problems, non-sticky films being obtained, which after thermal hardening show high mechanical, thermal and electrical property levels and good stability to chemicals.

The radiation-crosslinkable binder systems are formulated further by addition of catalysts for the thermal after-curing for the production of one- or two-component coating systems. Suitable as latent catalysts for the thermal after-curing of the epoxide groups are dicyandiamide, corresponding derivatives, or $BF_3$- or also $BCl_3$-amine complexes, acid anhydrides, or their adducts, imidazoles and phenolic hardeners.

Especially advantageous are latent catalysts which act both as photoinitiators in the crosslinking and as hardening catalysts in the thermal hardening such as compounds of the Michler's ketone type of the formula

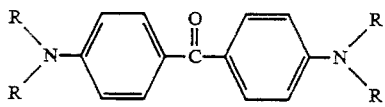

wherein R is $CH_3$- or $CH_2H_5$-. Very short curing times of 20 to 40 minutes are achieved at temperatures of from 120° to 230° C., depending on which glass temperature is to be reached for the coating system.

The resulting coatings are plastically deformable in the desired manner so that the danger of the formulation of lacquer splinters at low mechanical stress is ruled out. The coating materials of the invention are largely insensitive to visible light and they crosslink only under irradiation with UV light or still shorter, high-energy radiation. The advantage of this is that they can be processed without any special dark-room measures.

For the production of photoresists, circuit boards are coated with the above radiation crosslinkable coating agents hardenable by screen printing or curtain coating methods or respectively the other described application methods with the use of solvents. After the solvent has dried or evaporated, the resin is exposed to radiation through a negative or positive mask, with the exposed areas hardening by polymerization and the unpolymerized portions of the resin being able to be removed with a solvent. The coating material has the special feature that very fine structures can still be produced with great precision, and that the solving-out of the unpolymerized portions, the so-called development process, is possible with ecophile solvents such as butyldiglycol, but also with alkaline, aqueous solutions.

Depending on the planned use and depending on the type of formulation, the coating materials of the invention can be used solvent-free or they may contain the usual solvents. Suitable solvents which can be used alone or in mixtures, are ketones such as dimethyl ketone, diethyl ketone, methylisobutyl ketone, cyclohexanone, cyclopentanone, cycloheptanone, isophorone, methoxyhexanone, acetonyl acetone, acetophenone, benzylethyl ketone, 3,3,5-trimethylcyclohexanone and mesityl oxide; halogenized hydrocarbons such as carbon tetrachloride, chloroform, methylene chloride, methylene bromide, bromochloromethane, 1,2-dichloroethane, 1,1,2-trichloroethane, 1,1,2,2-tetrachloroethane, 1,2,3-trichloropropane and perchloroethylene; alcohols such as methanol, ethanol, propanol, butanol, hexanol, cyclohexanol, furfuryl alcohol, tetrahydrofurfuryl alcohol and benzyl alcohol; monoalkylated glycols such as methylglycol, ethylglycol, ethylglycol; triethylene glycol monoethyl- or monobutyl ethers; glycols such as ethylene, propylene or butylene glycol, and their oligomers such as triethylene glycol; aliphatic and aromatic hydrocarbons such as pentane, hexane, cyclohexane, methylcyclohexane, benzene, toluene or xylene; ethers such as diethyl ether, dibutyl ether, tetrahydrofurane, dioxane, ethylene glycol dimethyl ether or diethylene glycol dimethyl ether; carboxylic acid esters such as methyl, ethyl, propyl, butyl and isopropyl acetate as well as phenyl acetate propionic acid methyl ester, glycolic acid butyl ester, ethylglycol mono- or diacetate methyl or ethyl glycolic acid acetate; lactones such as butyrovalerol acetone; acid amides such as dimethylformamide, dimethylacetamide, hexamethylphosphoric acid triamide and sulfones as e.g. dimethyl sulfone, dibutylsulfone or tetramethylene sulfone e.g. dimethyl sulfone, dibutyl sulfone or tetramethylene sulfone.

The amount of solvent used depends essentially on the desired viscosity of the coating material which at 25° C. is preferably between 200 and 800, more particularly between 200 and 500 mPa s, as well as on the amount of fillers used. It is generally in the range of 25 to 40% by weight of the binders contained in the coating material.

The coating materials of the invention may contain fillers even without solvent. With solvents, the filler may amount to 80 to 120% by weight, based on the binder mixture. Despite the high filler content, however, the viscosity is still sufficient, permitting the use of the coating material in the pouring process. Despite the high filler content, the radiation-caused crosslinking is not impeded either in its speed or in its thickness of the crosslinking layer. Despite the high filler content, even high layer thicknesses can be applied without bubbles, and after the exposure, a high resolution is obtained, so that no so-called undercutting occurs even when the finest line technique is used.

On the other hand, precisely due to the high filler content, definite improvements of the coating material are achieved. Application of thick layers in one operation by curtain coating is possible with very good edge covering. Shrinkage during the drying of the applied coating is minimized. Especially advantageous is an automatic and reliable closing of via holes through the applied coating.

The fillers used must be finely divided, that is, the particle size of the filler must be smaller than the spacing of conductors in printed circuits. The mean particle size may be 0.01 to 10/um, preferably 0.01 to 5/um. Especially preferred are micronized fillers which generally have a mean particle size of 0.01 to 1.5/um.

Suitable fillers are colloidal or hydrophobized silicon dioxide, microtalc, micromica, kaolin, aluminum oxides, magnesium silicate, aluminum hydroxide, calcium silicate, aluminum silicate, magnesium carbonate, calcium carbonate, zirconium silicate, ground porcelain, antimony trioxide, titanium dioxide, barium titanate or barium sulfate, or mixtures of said fillers.

Advantageously, the fillers are provided with an adhesion promoter to achieve good adhesion between polymer matrix and filler. Examples of common adhesion promoters are trialkoxysilanes containing functional groups such as -OH, -NH, epoxy or vinyl groups.

Examples are trialkoxysilyl-glycidoxy or -amino propane and trialkoxyvinyl or allyl silane. The alkoxy group may contain 1 to 12 carbon atoms and may be methyl, ethyl, propyl, butyl, hexyl, octyl or dodecyl.

The coating materials of the invention may also contain common additives such as adhesion promoters, leveling agents, dyes, pigments, stabilizers, antifoaming agents, fire retardants, photosensibilizers and/or activators.

It is especially desirable to add antisettling materials to increase the storage stability of the coating agents of the invention and to preserve their processability. It is thereby avoided that the filler will settle and therefore must be homogenized again before processing. The antisettling agent may be added in amounts of 0.1 to 3% by weight, based on the filler. Examples of such agents are highly disperse silicic acid, montmorillonite, bentonites or xonolith.

The coating materials are produced by conventional methods by mixing the components, preferably applying high shearing forces. They can be processed by the usual methods such as brushing, spraying, rolling and immersing, particularly by screen printing, roller coating, tampon printing or centrifugal deposition as well as by conventional spraying (with compressed air or by the socalled airless process) or respectively by electrostatic spraying or by a combination of these methods.

The preferred curtain pouring process, for which the coating materials of the invention is especially suited can be carried out as follows: A thin, falling curtain of the coating agent is generated which flows with or without pressure from a gap, the viscosity of the coating material being preferably between 200 and 500 mPa s. The rate of fall of the curtain is selected so that on impinging on the board, it is 60 to 150, preferably 70 to 120 m/min. Advantageously, the board to be coated is preheated, e.g. up to 40° to 100° C. and the board is guided through the falling curtain at a speed which is approximately equal to and preferably greater than the rate of fall of the curtain. After the coating, the solvent is removed slowly (waste air drying in a through-type or holding furnace) to avoid bubble formation, the board is exposed and developed, and thereafter the protective layer is hardened thermally.

In the following examples, there are described several preferred embodiments to illustrate the invention. However, it should be understood that the invention is not intended to be limited to the specific embodiments.

EXAMPLES 1 to 4

For the production of an olefinic unsaturated ester of an epoxy novoalac resin (epoxy novolac vinyl ester) as binder component A, one equivalent of a phenolic novolac was introduced into a 3-neck flask equipped with a stirrer, a reflux condensor and a thermometer after which sufficient solvent was added to the flask to form a 70% solution. The mixture was heated with stirring to form the solution and then 1.02 moles of acrylic acid or methacrylic acid and catalyst were added thereto. The mixture was then heated to 75° to 85° C. and the epoxide number and acid number was continuously checked until the acid number was <5 and the epoxide number was 0.5%. The solution was then adjusted to 70% solids content and the results are reported in Table I.

TABLE I

| | Component A Olefinic unsaturated ester of novolac epoxy resins | | | | | | | |
|---|---|---|---|---|---|---|---|---|
| | | | | | Reaction time (h) | Reaction product, 70% in methoxypropyl acetate | | |
| Ex. | Novolac epoxy resin base | Mean functionality | EP equivalent | Unsat. acid employed | Reaction temp. (°C.) | Acid number mg KOH/g | EP equiv. g/equiv | Visc/25° C. mPa s |
| 1 | Phenol | 3.5 | 182 | Acrylic | 72/75 to 85 | <5 | >8,600 | 2,500 |
| 2 | o-Cresol | 6 | 202 | Acrylic | 80/75 to 85 | <5 | >8,600 | 13,000 |
| 3 | o-Cresol | 6 | 202 | Methacrylic | 95/75 to 85 | <5 | >8,600 | 13,600 |
| 4 | Bisphenol-A | 8 | 205 | Acrylic | 76/75 to 85 | <5 | >8,600 | 14,000 |

EXAMPLE 5

For the production of the hydroxyl containing epoxy resins of binder component B by the process of European Patent No. 0,194,360, 1' mole or 619 g of a phenolic novolac epoxy resin with an average functionality of 3.5 were placed in a 3-neck flask equipped with a stirrer, a reflux condensor and a thermometer. 200 g of xylene were added to the flask and the mixture was heated to 80° C. After 30 minutes, 1.2 moles of 90% lactic acid were added dropwise and the mixture was stirred at 80° C. for two hours. When the acid number reached <0.5 mg of KOH/g, the xylene and water were distilled and the mixture was diluted with methoxypropyl acetate to obtain a solution of 70% solids with an epoxy equivalent of 452 g and a hydroxyl equivalent of 432 g.

EXAMPLE 6

The procedure of Example 5 was repeated with an o-cresol novolac epoxy resin with a functionality of 6.5 in a molar ratio of said epoxy resin to lactic acid of 1:1.63 to obtain a 70% solids solution with an epoxy equivalent of 430 g and a hydroxyl equivalent of 635 g.

EXAMPLE 7

The procedure of Example 5 was repeated with a bisphenol-A novolac epoxy resin with a functionality of 8 in a molar ratio of said epoxy resin to lactic acid of 1:1.33 to obtain a 70% solids solution with an epoxy equivalent of 387 g and a hydroxyl equivalent of 950 g.

EXAMPLE 8

For the reaction of a polyisocyanate with a hydroxyl containing unsaturated compound, 174 g (1 mole) of a 2,4- and 2,6-toluylene diisocyanate mixture (Desmodur T-80) were placed in a 3-neck flask equipped with a stirrer, a reflux condensor and a thermometer and then 130 g of methoxypropyl acetate were added with stirring. 1 mole of 2-hydroxyethyl acrylate were added over 30 minutes beginning at room temperature and because the reaction was exothermic, the temperature rose to 80° C. The mixture was held at 80° C. for one hour after which 500 ppm of hydroquinone were added as a stabilizer to obtain a 70% solids solution with an isocyanate equivalent of 420 g.

EXAMPLE 9

432 g (1 hydroxyl equivalent) of the hydroxyl containing epoxy resin of Example 5 were placed in a 3-neck flask equipped with a stirrer, a reflux condensor and a thermometer and heated to 70° C. 336 g (0.8 NCO equivalent) of monoisocyanate of Example 8 were added dropwise over two hours at 70° C. After 15 hours of reaction, isocyanate was no longer visible by IR spectroscopy and the 70% solids solution had a viscosity of 42,500 mPa s at 25° C.

EXAMPLE 10

635 g (1 hydroxyl equivalent) of the hydroxyl containing epoxy resin of Example 6 were placed in a 3-neck flask equipped with a stirrer, a reflux condensor and a thermometer and then heated to 70° C. 336 g (0.8 NCO equivalent) of monoisocyante of Example 8 were added dropwise over 2 hours at 70° C. and after 15 hours of reaction, no isocyanate was present. The 70% solids solution had a viscosity of 62,100 mPa s at 25° C.

EXAMPLE 11

950 g (1 hydroxyl equivalent) of the hydroxyl containing epoxy resin of Example 7 were placed in a 3-neck flask equipped with a stirrer, a reflux condensor and a thermometer and were heated to 70° C. 336 g of the monoisocyanate of Example 8 (0.8 NCO equivalent) were added drowise over two hours at 70° C. and after 15 hours of reaction, no isocyanate was present. The 70% solids solution had a viscosity of 130,000 mPa s at 25° C.

EXAMPLES 12 to 17

Mixtures A of Table II were formed by mixing the components in a planetary mixer for 30 minutes and then were mixed in a 6:1 weight ratio with a photoinitiator paste comprised of 4 parts of polyvinyl butyral resin, 17.55 parts of benzildimethyl ketal, 2.45 parts of benzophenone and 76.0 parts of methoxypropyl acetate (PMA) to produce coating material. Phenolic resin-based printed circuit boards were coated with the coating material by the curtain pouring process to obtain perfectly coated boards free of bubbles with good edge covering. The boards were shielded by a template in a known manner and were exposed, developed, thermally hardened and tested and evaluated by known methods. The results are listed in Table III and the following evaluations were reposed + +very good+good+- —satisfactory—bad — —very bad.

COMPARATIVE EXAMPLE 18

A coating material was prepared according to Example 1 of EP-B 0,075,537 using equal parts by weight of the binders of Example 4 and 9 of the present application. The coating material had a viscosity of 360±20 mPa s at 24° C. and a solids content of 39±2% by weight. The coating agent was applied to phenolic resin printed circuit boards by the curtain coating process resulting in no improved edge covering of the boards (defective coating, i.e. many pinholes), very poor adhesion and poor solder bath stability. Other evaluations are in Table III.

EXAMPLE 19

Using the procedure of Examples 12 to 17, a coating agent of the following composition was prepared in a binder component to photoinitiator paste weight ratio of 6:1.

|  | Wt. % |
|---|---|
| Binder component: | |
| Epoxy novolac from Example 4 (70% in PMA) | 31.50 |
| UV-crosslinkable resin from Example 9 (70% in PMA) | 39.00 |
| Dicyanodiamiae | 0.60 |
| Cu-phthalocyanine Green | 0.35 |
| Talc | 26.85 |
| Antifoaming agent (Byk ® 051) | 0.20 |
| Leveling agent (Modaflow ®) | 0.90 |
| Methoxypropyl acetate | 0.50 |
| Photoinitiator paste | |
| Polyvinylbutyral resin | 6.60 |
| Benzildimethyl ketal | 25.20 |
| Benzophenone | 1.95 |
| Methoxypropanol | 66.25 |

The coating agent was then applied to a phenolic resin printed circuit board by the screen printing method and then treated and evaluated as in Table III.

Various modifications of the compositions and method of the invention may be made without departing from the spirit or scope thereof and it is to be understood that the invention is intended to be limited only as defined in the appended claims.

What we claim is:

1. A coating material crosslinkable by radiation comprising
   a. an olefinic unsaturated ester of an epoxy novolac resin,
   b. a binder formed by reaction of an epoxy compound having more than one epoxide group per molecule with at least one carboxylic acid in a molar ratio of epoxy groups per carboxyl group of 1:0.5 to 0.9 and subsequent reaction of the resulting reaction product with at least one unsaturated isocyanate ester formed by reaction of a compound with at least two isocyanate groups with a member of the group consisting of hydroxyl containing acrylic acid, methacrylic acid and cyanacrylic acid esters,
   c. at least one latent hardener,
   d. at least one photoinitiator,
   e. fillers selected from the group consisting of colloidal or hydrophobized silicon dioxide, microtalc, micromica, kaolin, aluminum oxides, magnesium silicate, aluminum hydroxide, calcium silicate, aluminum silicate, magnesium carbonate, calcium carbonate, zirconium silicate, ground porcelain, antimony trioxide, titanium dioxide, barium titanate and barium sulfate, and mixtures of said fillers, wherein the filler content is 80% to 120% by weight of the binder mixture of components and the mean particle size of the fillers is in the range of 0.01 to 10 μm and
   f. further additives, adjuvants and solvents.

2. A coating material of claim 1 wherein binder components a) and b) are in a weight ratio of 80:20 to 20:80.

3. A coating material of claim 1 wherein binder component b) contains a novolac whose phenolic hydroxyl groups are etherified with glycidyl groups as the epoxy compound.

4. A coating material of claim 1 wherein binder component b) has an average molecular weight of 500 to 10,000.

5. A coating material of claim 1 wherein in component b) the qarboxylic acid-modified epoxy resin and the isocyanate carbamate esters have a molar ratio of hydroxyl groups to isocyanate groups of 1:08 to 1:1.

6. A coating material of claim 1 wherein the latent hardeners for the crosslinking and thermal hardening are compounds of the Michler ketone

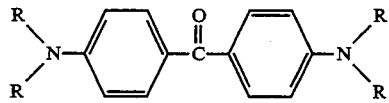

wherein R is $CH_3$ or $C_2H_5$.

7. A coating material of claim 1 containing 25 to 40% by weight of solvent based on the total coating agent weight.

8. A protective coating film formed by radiation cross-linking of a film of a coating mateiral agent of claim 1.

TABLE II

| Raw materials in parts by weight | Examples 12 to 17 (application by curtain pouring) | | | | | |
|---|---|---|---|---|---|---|
| | Example 12 | Example 13 | Example 14 | Example 15 | Example 16 | Example 17 |
| Epoxynovolac vinyl ester from Example 4 (70% in PMA) | 45.60 | 28.50 | 11.40 | 26.80 | 25.09 | 22.80 |
| UV-crosslinkable resin from Example 9 (70% in PMA) | 11.40 | 28.50 | 45.60 | 26.80 | 25.09 | 22.80 |
| Dicyanodiamide | 0.45 | 0.45 | 0.45 | 0.45 | 0.45 | 0.45 |
| Cu-phthalocyanine Green | 0.40 | 0.40 | 0.40 | 0.40 | 0.40 | 0.40 |
| Magnesium silicate | 12.00 | 15.60 | 9.00 | 15.60 | 15.60 | 15.60 |
| Talc | 3.60 | | 10.60 | 3.40 | 6.82 | 10.00 |
| Barium sulfate | 12.00 | 12.00 | 8.00 | 12.00 | 12.00 | 12.00 |
| Antiforming agent (Byk ® 051) | 1.20 | 1.00 | 1.40 | 1.20 | 1.30 | 1.10 |
| Leveling agent (Modaflow ®) | 0.50 | 0.70 | 0.30 | 0.50 | 0.40 | 0.60 |
| Methoxypropyl acetate | 12.85 | 12.85 | 12.85 | 12.85 | 12.85 | 14.25 |

TABLE III

| | Properties of the coating agents | | | | | | | |
|---|---|---|---|---|---|---|---|---|
| | Example 12 | Example 13 | Example 14 | Example 15 | Example 16 | Example 17 | Example 18 | Example 19 |
| Color | Green transparency | | | | | | | |
| Solids content (MV, 1 h/125° C. 1 g weighed in) | 63 ± 3 | | | | | | 39 ± 2 | 76 ± 3 |
| Lacquer application in g/m² | 100 | | | | | | 100 | 40–60 |
| Predrying | 30 min at 80° C. | | | | | | | |
| Exposure (Fe-doped lamp 6000 W) | 60 cycles | | | | | | | |
| Film tackiness during exposure (film sticks) | ++ | ++ | ++ | ++ | ++ | ++ | ++ | ++ |
| Developer (2 min − 30° C.) | Butyldiglycol | | | | | | | |
| Thermal hardening | 30 min at 150° C. | | | | | | | |
| Photosensitivity (Stouffer gray scale on extended copper) | 9 | 10 | 8 | 9 | 7 | 10 | 4 | 9 |
| Fineness resolution (Stouffer Resolution Guide) Level | +− | + | ++ | + | +− | ++ | +− | + |
| Adhesion on metallic substrate (Grid cut and Tesa tear-off) before soldering | Gt 1 | Gt 1 | Gt 0 | Gt 0 | Gt 0 | Gt 0 | Gt 1 | Gt 0 |
| after soldering (10 sec − 260° C., TL 33) | Gt 2 | Gt 0 | Gt 0 | Gt 0 | Gt 0 | Gt 0 | Gt 2 | Gt 0 |
| Surface evaluation, e.g. pinholes | +− | + | +− | + | ++ | ++ | +− | + |
| Solder bath stability (260° C.) | 15 sec | 15 sec | 20 sec | 15 sec | 20 sec | 25 sec | 10 sec | 20 sec |
| Methylene chloride stability | 2h | | | | | | 1 h | 2 h |
| Closing of riser bores | ++ | | | | | | +− | + |
| Undercutting | ++ | ++ | ++ | ++ | ++ | ++ | −− | ++ |

* * * * *